(12) United States Patent
Abatchev et al.

(10) Patent No.: US 7,473,645 B2
(45) Date of Patent: Jan. 6, 2009

(54) METHOD OF DEPOSITING A LAYER COMPRISING SILICON, CARBON, AND FLUORINE ONTO A SEMICONDUCTOR SUBSTRATE

(75) Inventors: Mirzafer Abatchev, Boise, ID (US); Krupakar M. Subramanian, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 47 days.

(21) Appl. No.: 11/601,362

(22) Filed: Nov. 16, 2006

(65) Prior Publication Data

US 2007/0066068 A1 Mar. 22, 2007

Related U.S. Application Data

(62) Division of application No. 11/206,414, filed on Aug. 18, 2005, now Pat. No. 7,291,563.

(51) Int. Cl.
*H01L 21/331* (2006.01)
(52) U.S. Cl. .................. 438/694; 438/695; 438/725; 438/780; 216/54
(58) Field of Classification Search .................. 438/780, 438/694, 695, 725; 216/54
See application file for complete search history.

(56) References Cited

U.S. PATENT DOCUMENTS

| | | | |
|---|---|---|---|
| 5,994,226 A | 11/1999 | Kadomura | |
| 6,368,982 B1 | 4/2002 | Yu | |
| 6,521,546 B1 * | 2/2003 | Barnes et al. | 438/778 |
| 6,593,248 B2 * | 7/2003 | Loboda et al. | 438/758 |
| 6,673,685 B2 | 1/2004 | Mori et al. | |
| 6,716,758 B1 | 4/2004 | Donohoe et al. | |
| 6,716,770 B2 * | 4/2004 | O'Neill et al. | 438/780 |
| 6,884,727 B2 | 4/2005 | Zhang et al. | |
| 7,112,533 B2 | 9/2006 | Abatchev et al. | |
| 2002/0072248 A1 * | 6/2002 | Cheng et al. | 438/778 |
| 2002/0106460 A1 * | 8/2002 | Lee et al. | 427/569 |
| 2003/0024643 A1 | 2/2003 | Abatchev et al. | |
| 2004/0018742 A1 | 1/2004 | He et al. | |
| 2005/0092983 A1 | 5/2005 | Lyons et al. | |
| 2006/0046483 A1 | 3/2006 | Abatchev et al. | |
| 2006/0105577 A1 | 5/2006 | Donohoe et al. | |
| 2006/0124982 A1 | 6/2006 | Ho et al. | |
| 2006/0141679 A1 | 6/2006 | Subramanian et al. | |
| 2006/0252269 A1 | 11/2006 | Panda et al. | |

* cited by examiner

Primary Examiner—Trung Dang
(74) Attorney, Agent, or Firm—Wells St. John P.S.

(57) ABSTRACT

The invention includes methods of etching substrates, methods of forming features on substrates, and methods of depositing a layer comprising silicon, carbon and fluorine onto a semiconductor substrate. In one implementation, a method of etching includes forming a masking feature projecting from a substrate. The feature has a top, opposing sidewalls, and a base. A layer comprising $Si_xC_yF_z$ is deposited over the feature, where "x" is from 0 to 0.2, "y" is from 0.3 to 0.9, and "z" is from 0.1 to 0.6. The $Si_xC_yF_z$—comprising layer and upper portions of the feature opposing sidewalls are etched effective to laterally recess such upper portions proximate the feature top relative to lower portions of the feature opposing sidewalls proximate the feature base. After such etching of the $Si_xC_yF_z$—comprising layer and such etching of upper portions of the feature sidewalls, the substrate is etched using the masking feature as a mask.

28 Claims, 7 Drawing Sheets

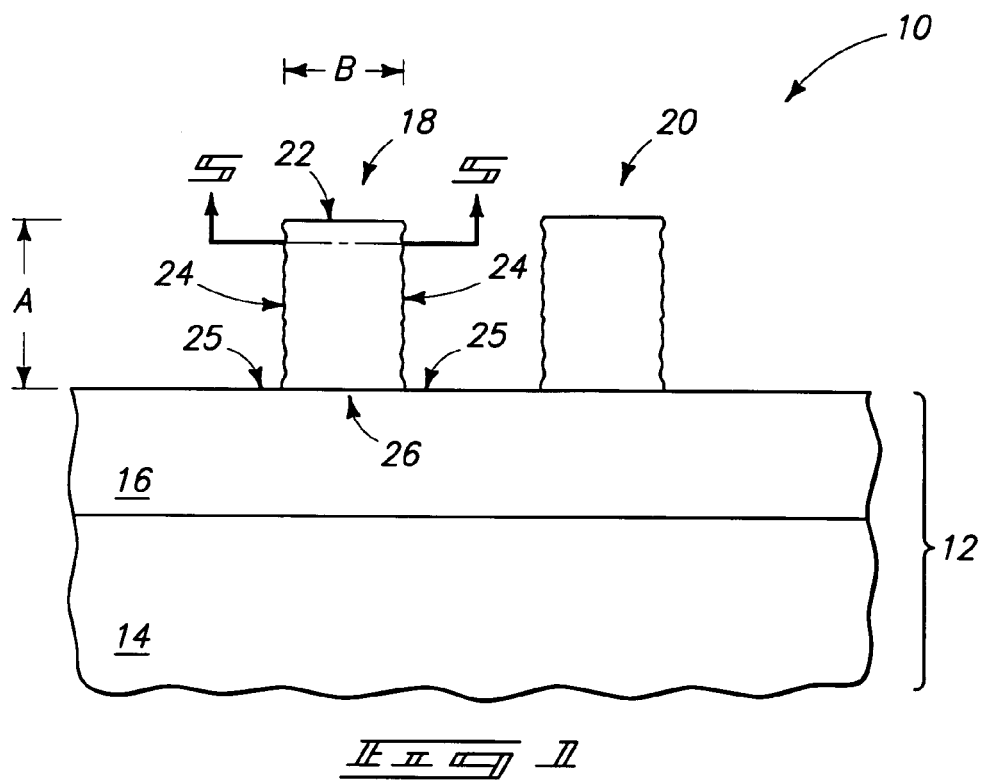
_Fig. 1_
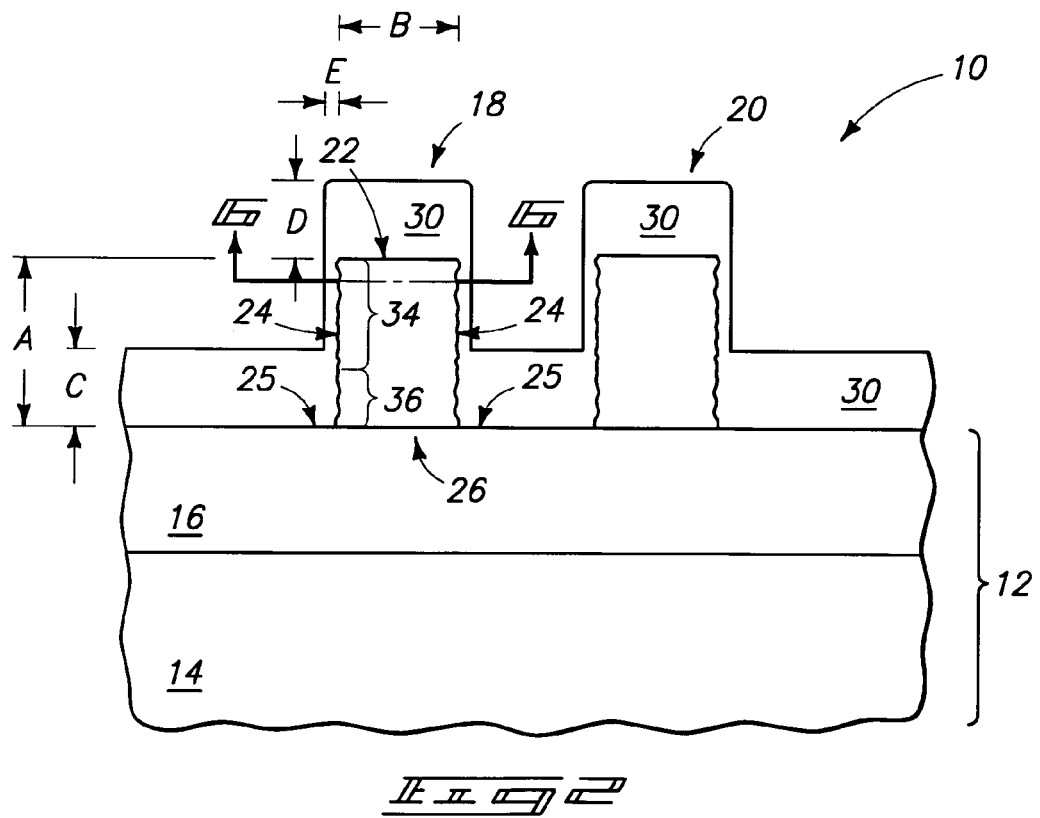
_Fig. 2_

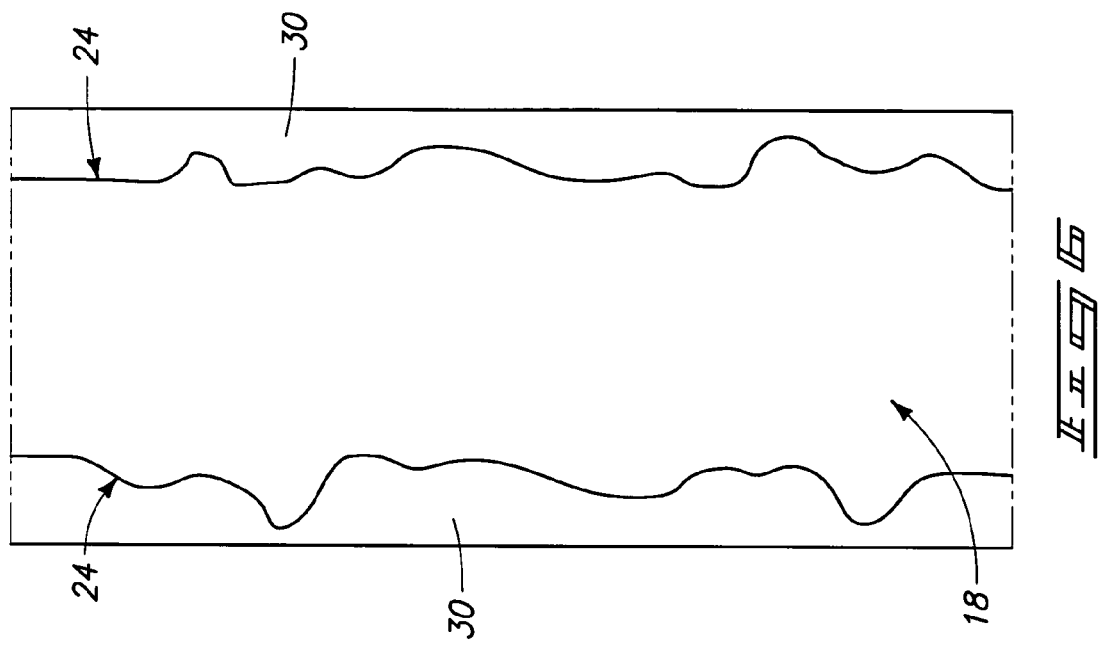
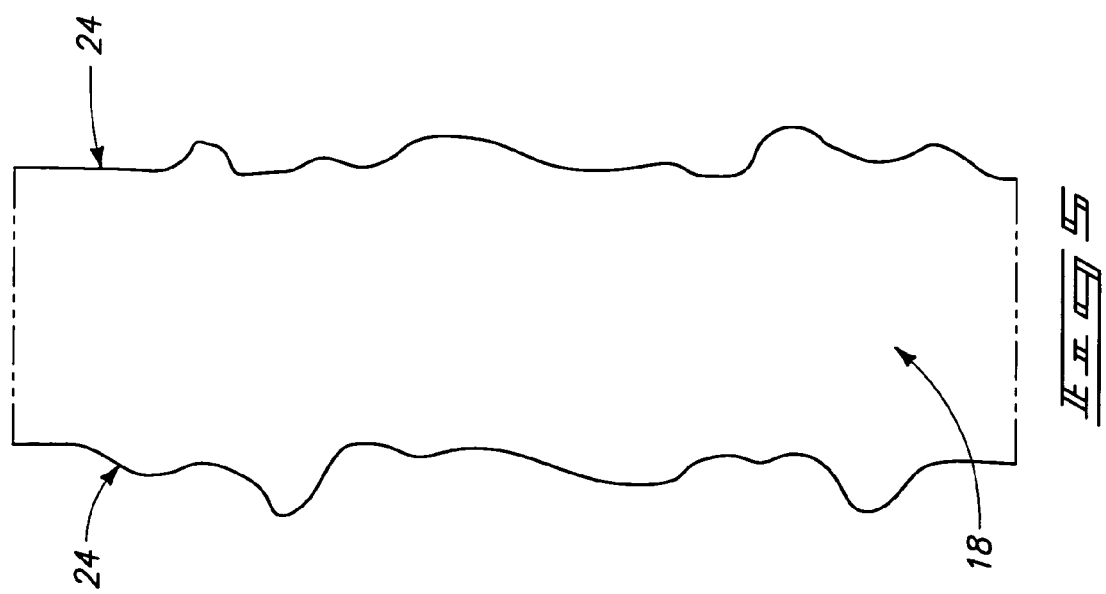

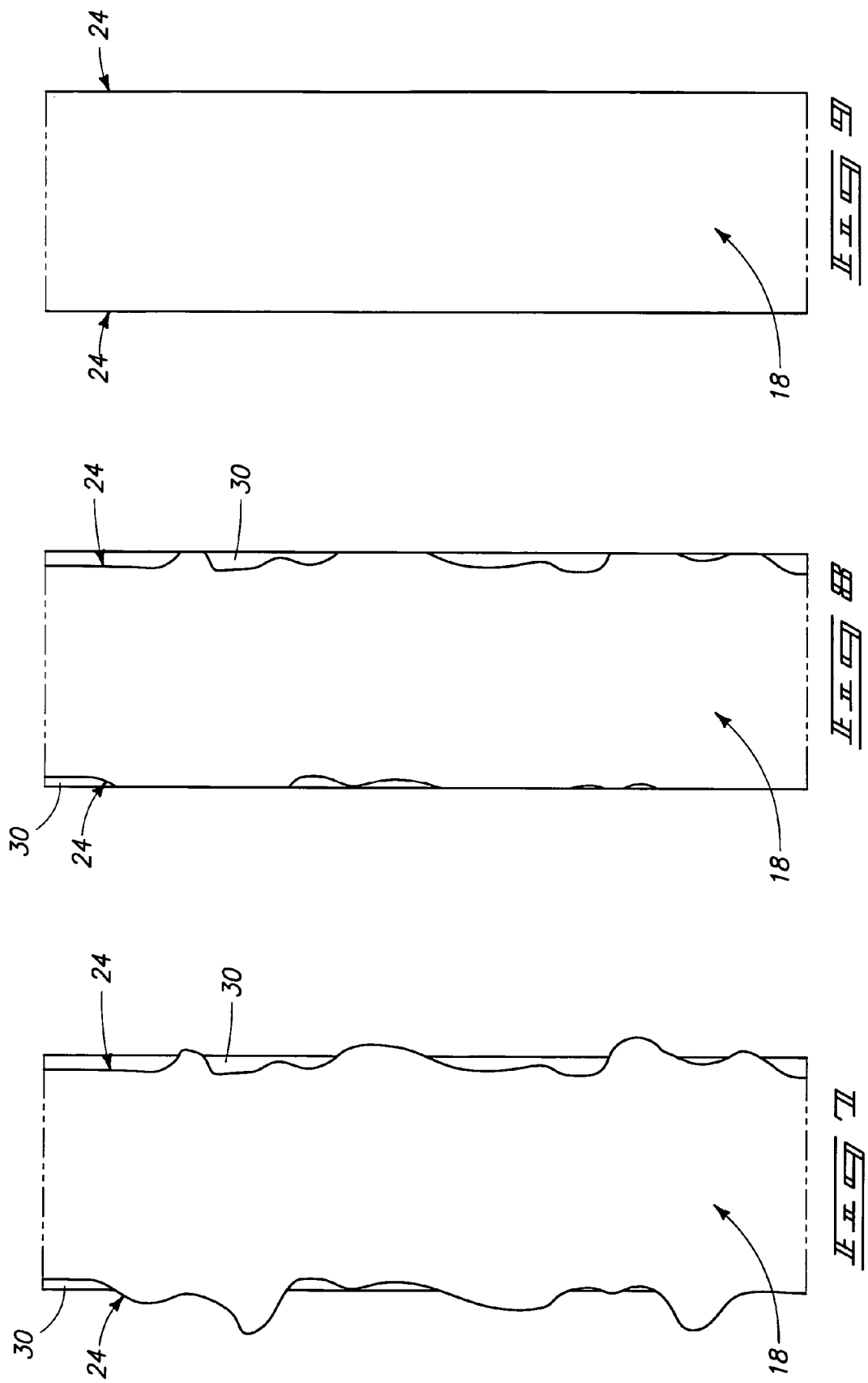

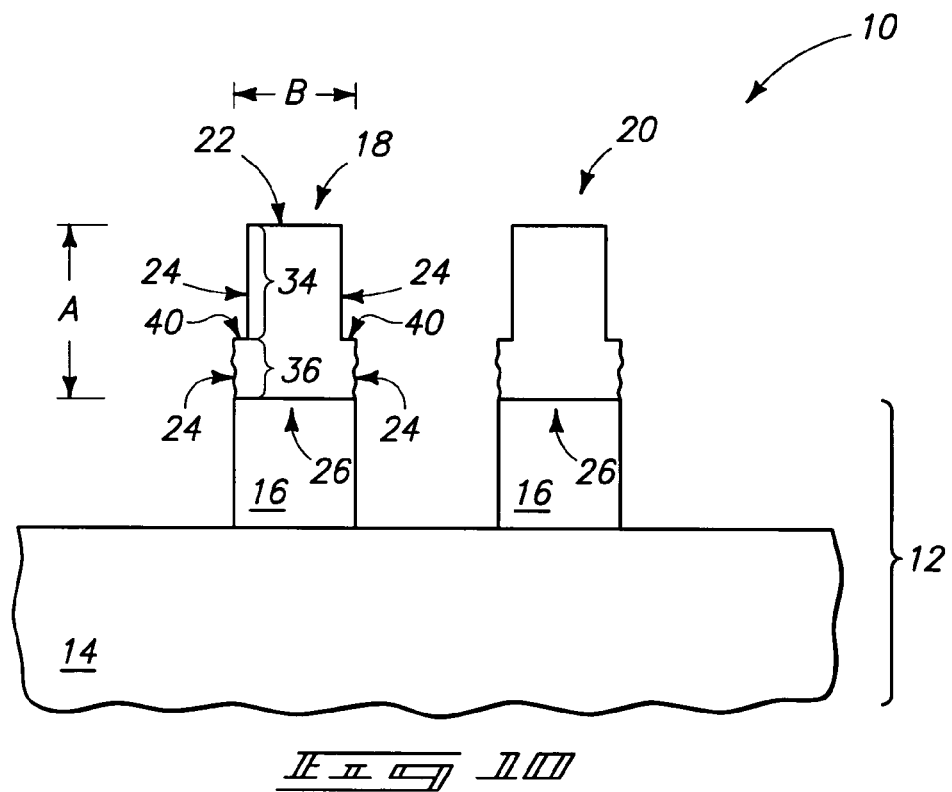
F I G. 10
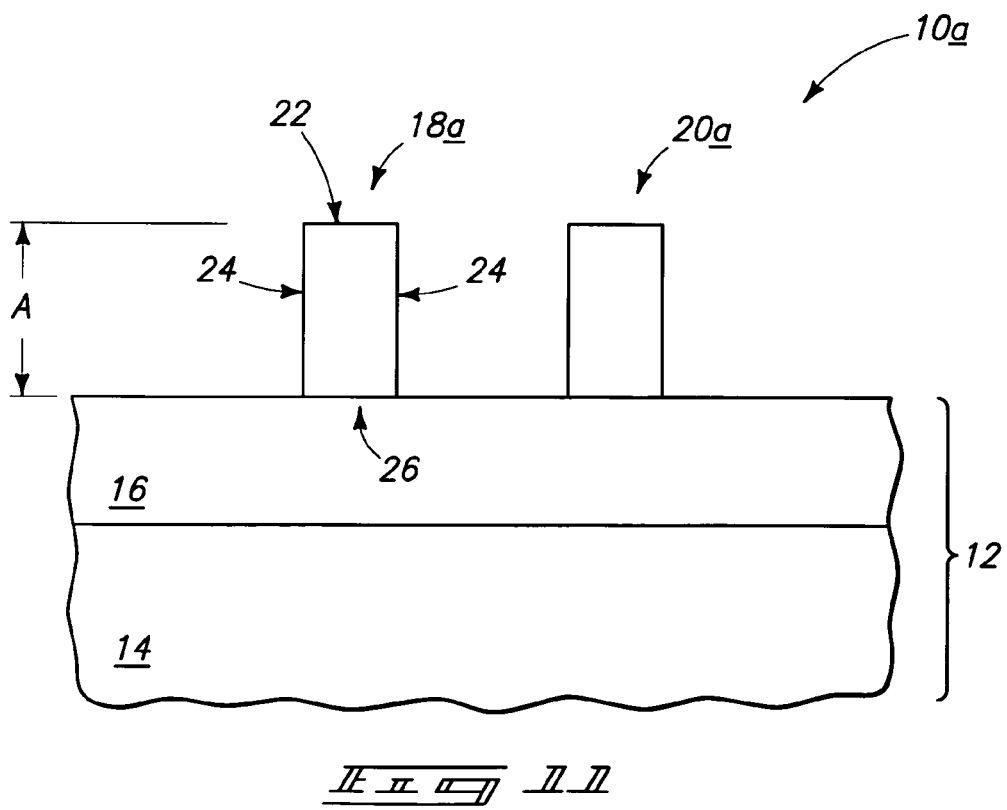
F I G. 11

METHOD OF DEPOSITING A LAYER COMPRISING SILICON, CARBON, AND FLUORINE ONTO A SEMICONDUCTOR SUBSTRATE

This patent resulted from a divisional application of U.S. patent application Ser. No. 11/206,414, filed Aug. 18, 2005 now U.S. Pat. No. 7,291,563, entitled "Method Of Etching A Substrate And Method Of Forming A Feature On A Substrate", naming Mirzafer Abatchev and Krupakar M. Subramanian as inventors, the disclosure of which is incorporated by references.

TECHNICAL FIELD

This invention relates to methods of etching substrates, to methods of forming features on substrates, and to methods of depositing a layer comprising silicon, carbon, and fluorine onto a semiconductor substrate.

BACKGROUND OF THE INVENTION

Photolithographic patterning and etch is a common technique by which integrated circuit components are fabricated on a substrate. A desired pattern is created in a masking material, such as photoresist, over an underlying substrate material to be etched. The patterned masking material thereby has a series of spaced projections atop underlying material. The underlying material is then etched typically using a chemistry that is selective to etch the material underlying the masking material at a greater rate than the masking material itself, thereby transferring the pattern of the masking material/projections into the substrate material therebeneath. Typically, the masking material is then etched away in a manner that is selective to remove it relative to the underlying substrate material in which the pattern was formed.

Ideally, it is desired that the sidewalls of the projections of the masking material be substantially vertical and very smooth. Unfortunately, and especially as device dimensions and, accordingly, mask features get smaller, the sidewalls of the masking projections can become intolerably rough. Further, masking features can have varied roughness at different locations on the sidewalls or different roughness in one projecting masking feature relative to another projecting masking feature. Accordingly, a subsequent etch of the material underlying the mask can produce less than desired results.

One prior art manner of smoothing rough sidewalls of a photoresist masking feature comprises a short isotropic etch using a halogen-containing gas after mask formation. However, such does not significantly improve sidewall roughness, reduces the thickness of the photoresist masking blocks, and in certain instances can form breaks in long-running masking features, such as in parallel lines.

While the invention was motivated in addressing the above identified issues, it is in no way so limited. The invention is only limited by the accompanying claims as literally worded, without interpretative or other limiting reference to the specification, and in accordance with the doctrine of equivalents.

SUMMARY

The invention includes methods of etching substrates, methods of forming features on substrates, and methods of depositing a layer comprising silicon, carbon and fluorine onto a semiconductor substrate. In one implementation, a method of etching a substrate includes forming a masking feature projecting from a substrate. The feature has a top, opposing sidewalls, and a base. A layer comprising $Si_xC_yF_z$ is deposited over the feature, where "x" is from 0 to 0.2, "y" is from 0.3 to 0.9, and "z" is from 0.1 to 0.6. The $Si_xC_yF_z$—comprising layer and upper portions of the feature opposing sidewalls are etched effective to laterally recess the upper portions of the feature opposing sidewalls proximate the feature top relative to lower portions of the feature opposing sidewalls proximate the feature base. After such etching of the $Si_xC_yF_z$—comprising layer and such etching of upper portions of the feature sidewalls, the substrate is etched using the masking feature as a mask.

In one implementation, a method of forming a feature on a substrate includes providing a construction projecting from a substrate. The construction has a top, opposing sidewalls, and a base. A layer comprising $Si_xC_yF_z$ is deposited over the construction where "x" is from 0 to 0.2, "y" is from 0.3 to 0.9, and "z" is from 0.1 to 0.6. The $Si_xC_yF_z$—comprising layer and upper portions of the construction opposing sidewalls are etched effective to laterally recess the upper portions of the construction opposing sidewalls proximate the construction top relative to lower portions of the construction opposing sidewalls proximate the construction base.

In one implementation, a method of depositing a layer comprising silicon, carbon and fluorine onto a semiconductor substrate includes positioning a semiconductor substrate within a deposition chamber. The deposition chamber includes an exposed silicon-comprising component, where such chamber component is something other than the semiconductor substrate. Gas comprising carbon and fluorine is fed to the semiconductor substrate within the deposition chamber under conditions effective to deposit a layer comprising silicon, carbon, and fluorine onto the semiconductor substrate. Silicon in such layer at least partially comes from silicon which is removed from said silicon-comprising component during said feeding.

Other aspects and implementations are contemplated.

BRIEF DESCRIPTION OF THE DRAWINGS

Preferred embodiments of the invention are described below with reference to the following accompanying drawings.

FIG. 1 is a diagrammatic sectional view of a substrate fragment in process in accordance with an aspect of the invention.

FIG. 2 is a view the FIG. 1 substrate fragment at a processing subsequent to that shown by FIG. 1.

FIG. 5 is a diagrammatic enlarged sectional view of a portion of the FIG. 1 substrate taken through line 5-5 in FIG. 1.

FIG. 6 is a view the FIG. 5 substrate fragment at a processing subsequent to that shown by FIG. 5, and taken through line 6-6 in FIG. 2.

FIG. 7 is a view the FIG. 6 substrate fragment at a processing subsequent to that shown by FIG. 6.

FIG. 8 is a view the FIG. 7 substrate fragment at a processing subsequent to that shown by FIG. 7.

FIG. 9 is a view the FIG. 8 substrate fragment at a processing subsequent to that shown by FIG. 8, and taken through line 9-9 in FIG. 4.

FIG. 10 is a view the FIG. 4 substrate fragment at a processing subsequent to that shown by FIG. 4.

FIG. 11 is a diagrammatic sectional view of a substrate fragment in process in accordance with an aspect of the invention.

DETAILED DESCRIPTION OF THE PREFERRED EMBODIMENTS

Figure 3:
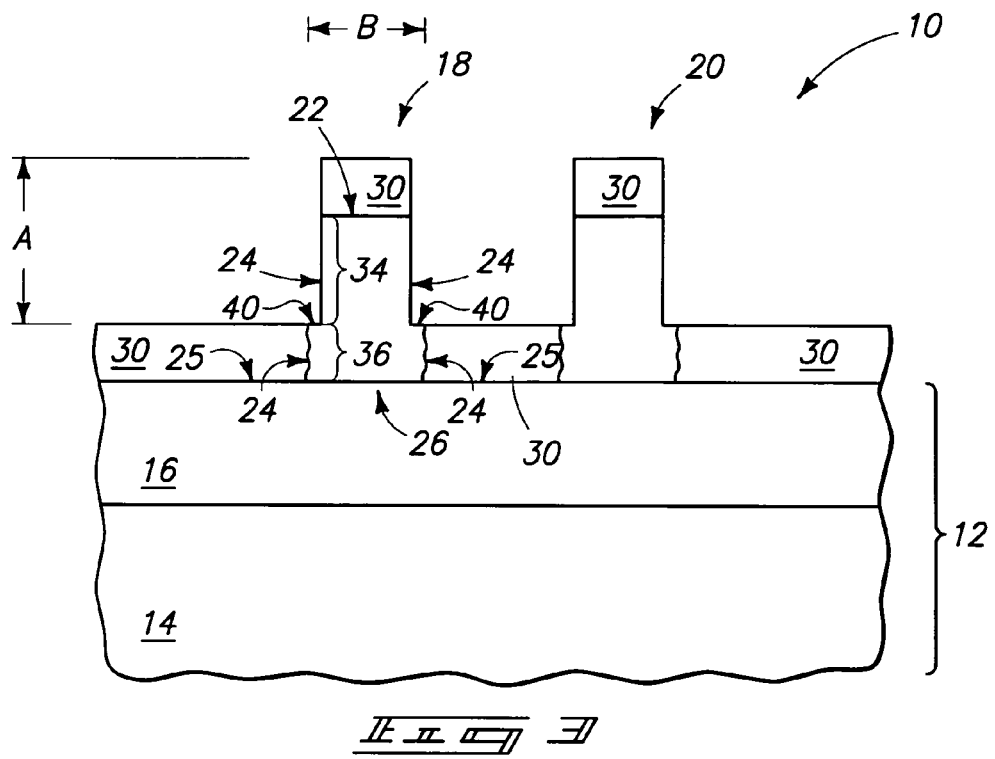
FIG. 3 is a view the FIG. 2 substrate fragment at a processing subsequent to that shown by FIG. 2.

This disclosure of the invention is submitted in furtherance of the constitutional purposes of the U.S. Patent Laws "to promote the progress of science and useful arts" (Article 1, Section 8).

Initially addressing problems which motivated the invention, for example as described above, one aspect of the invention herein contemplates a method of etching a substrate. However, aspects of the invention also contemplate methods of forming a feature on a substrate which may or may not constitute a part of the finished construction of an integrated circuit, and regardless of whether subsequent etching occurs, and if so regardless of whether the feature is used as an etch mask, or as another mask for ion implanting or other processing. Further, aspects of the invention contemplate a deposition method independent of whether a feature is formed on a substrate and regardless of whether a substrate is etched, as will be more fully developed below.

A first embodiment method of etching a substrate is initially described with reference to FIGS. 1-13. FIG. 1 depicts a substrate fragment indicated generally with reference numeral 10. Such is depicted as comprising a substrate 12, with such preferably comprising a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). Substrate 10 is depicted as comprising a first material 14 and an overlying material 16. By way of example only, an exemplary material 14 is lightly doped monocrystalline silicon, with material 16 comprising any suitable conductive, insulative, and/or semiconductive material formed thereover. For example and by way of example only, layer 16 might comprise a suitably conductive material from which electrically conductive lines will be formed. Alternately, by way of example only, in the depicted section, substrate 12 might be homogeneous, thereby comprising a single composition material. Further by way of example only, substrate 12 might constitute a semiconductor-on-insulator substrate.

Substrate fragment 10 is depicted as comprising a pair of masking features 18, 20 projecting from substrate 12. Discussion primarily proceeds with reference to processing relative to a single of such features, namely feature 18, although like processing typically inherently occurs relative to other features received over substrate 12. For purposes of the continuing discussion, feature 18 can be considered as having a top 22, opposing sidewalls 24, and a base 26. Further for purposes of the continuing discussion, substrate 12 can be considered as having an upper surface 25 proximate feature 18.

Masking features 18 and 20 might be respectively comprised of multiple materials (same or different), or of a single material, and be homogeneous or non-homogeneous. Materials of features 18 and 20 might be the same or different as materials 14 and 16. For example, masking features 18 and 20 might be of the same composition as material 16 whereby, for example, base 26 of feature 18 is approximated by that region proximate where feature sidewalls 24 join/meet with upper surface 25 of substrate 12. Further by way of example only, features 18 and 20 might be homogeneous with a single homogeneous composition substrate 12, at least in the depicted section. Accordingly, by way of example only, depicted substrate fragment 10 with features 18 and 20 might comprise a single homogeneous substrate (not shown). Further, features 18 and 20 might comprise one or more hard masking layers, for example including silicon dioxides and/or silicon carbides.

Regardless, exemplary preferred materials for features 18 and 20 include any one or combination of photoresist (for example, preferably a carbon-containing photoresist), amorphous carbon, transparent carbon (a form of amorphous carbon), $Si_3N_4$, Al, TiN, crystalline and/or amorphous silicon (whether doped or undoped), metal silicides, silicon dioxide (whether doped or undoped), and silicon carbide. Other materials are, of course, contemplated. In the context of this document, photoresist is any material comprising a photoactive compound that undergoes a chemical change in response to exposure to actinic energy, or the like, such that the material is capable of patterning using solvent or other processing subsequent to actinic energy exposure.

For purposes of the continuing discussion, feature 18 can be considered as projecting relative to substrate upper surface 25 by a distance A. By way of example only, an exemplary dimension A is from 1,000 Angstroms to 2,000 Angstroms. Further, feature 18 can be considered as having a widest lateral width B proximate substrate upper surface 25 (at base 26 in the illustrated example). By way of example only, an exemplary dimension B is from 400 Angstroms to 1,000 Angstroms. Features 18 and 20 are depicted as having vertically oriented sidewalls, which is generally preferred, although laterally inward or outward tapered sidewalls might also result. Opposed sidewalls 24 are also shown to have a degree of roughness in accordance with the problem identified above which motivated the invention. However, such sidewalls might by smooth/smoother the result of existing or later-developed methods which produce smooth/smoother sidewalls. Further in the exemplary depicted embodiment, features 18 and 20 have a minimum separation distance essentially equal to dimension B, and are essentially of the same size and shape. Different size and shape features 18 and 20 are contemplated, of course, and with separation distances therebetween being other than dimension B.

Referring to FIG. 2, a layer 30 comprising $Si_xC_yF_z$ is deposited over feature 18 where "x" is from 0 to 0.2, "y" is from 0.3 to 0.9, and "z" is from 0.1 to 0.6. A more preferred range is where "x" is from 0 to 0.0015, "y" is from 0.5 to 0.7, and "z" is from 0.3 to 0.4. Preferably, "x" is greater than zero. Further preferably where "x" is greater than zero, "y" is preferably from 0.6 to 0.9 and "z" is preferably from 0.1 to 0.4. Most preferably and as shown, $Si_xC_yF_z$—comprising layer 30 is deposited in a non-conformal manner having some minimum elevational thickness C over substrate upper surface 25, a minimal elevational thickness D over feature top 22, and a minimum lateral thickness E over opposing feature sidewalls 24, with minimum elevational thicknesses C and D each being greater than the minimum lateral thickness E. Dimensions C and D might be equal, as shown in FIG. 2. Alternately, dimensions C and D might be different, with either being larger or smaller than the other.

Preferably, the minimum elevational thickness C of $Si_xC_yF_z$—comprising layer 30 over substrate upper surface 25 is from 5% to 70% of A, and even more preferably from 10% to 30% of A. Further preferably, minimum lateral thickness E of $Si_xC_yF_z$—comprising layer 30 is from 1% to 30% of B, and even more preferably from 5% to 15% of B. Preferred manners of depositing $Si_xC_yF_z$—comprising layer 30 are described in more detail below. For purposes of the continuing discussion, opposing feature sidewalls 24 can be considered as comprising upper portions 34 proximate feature top 22 and lower portions 36 proximate feature base 25, and as likely at least in part determined by dimension C.

The $Si_xC_yF_z$—comprising layer and the upper portions of feature opposing sidewalls 24 are etched effective to laterally recess upper portions of the feature opposing sidewalls proximate the feature top relative to lower portions of feature opposing sidewalls proximate the feature base. By way of example only, exemplary techniques of doing so are described with reference to FIGS. 3-11. FIG. 3 depicts etching $Si_xC_yF_z$—comprising layer 30 and upper portions 34 of feature opposing sidewalls 24 effective to laterally recess upper portions 34 of feature opposing sidewalls 24 proximate feature top 22 relative to lower portions 36 of feature opposing sidewalls 24 proximate feature base 36. FIG. 3 depicts all of $Si_xC_yF_z$—comprising layer 30 as having been removed from upper portions 34 (at least in the depicted cross section) at this point in the process, although such is not required as will be explained in greater detail below. Such etching, preferably as shown, has also formed upper portions 34 of feature opposing sidewalls 24 after such etching to have less surface roughness than prior to such etching. Preferably, such etching which removes portions of depicted material 30 and material of which feature 18 is fabricated comprises at least one common chemistry etching step.

An exemplary preferred such etching chemistry includes using at least one of $NF_3$, $SF_6$, $SO_2$ and $O_2$. Such etching is preferably conducted in an isotropic manner, and also preferably utilizes plasma. Exemplary preferred conditions include a substrate temperature of from 5° C. to 70° C., a substrate pressure of from 5 mTorr to 20 mTorr, top power from 100 Watts to 500 Watts, bottom power from 0 Watts to 100 Watts, one or more respective reactive gas flows at 10 sccm to 100 sccm, and inert gas flow at from 0 sccm to 200 sccm. The invention was reduced-to-practice utilizing a chemistry comprising $NF_3$ and argon at respective flow rates of 20 sccm and 80 sccm in a plasma etching reactor at a pressure of 10 mTorr, a substrate temperature of 5° C., a top applied power of 200 W, and a bottom applied power of 0 W.

Regardless, in the exemplary and preferred depicted embodiment, the FIG. 3 etching has been effective to form a step 40 extending substantially orthogonally from laterally recessed upper portions 34 on each of feature opposing sidewalls 24. In the context of this document, "substantially orthogonally" requires an angle which is normal or within 15° of normal to surface 24 of upper portion 34 from which step 40 extends.

Figure 4:
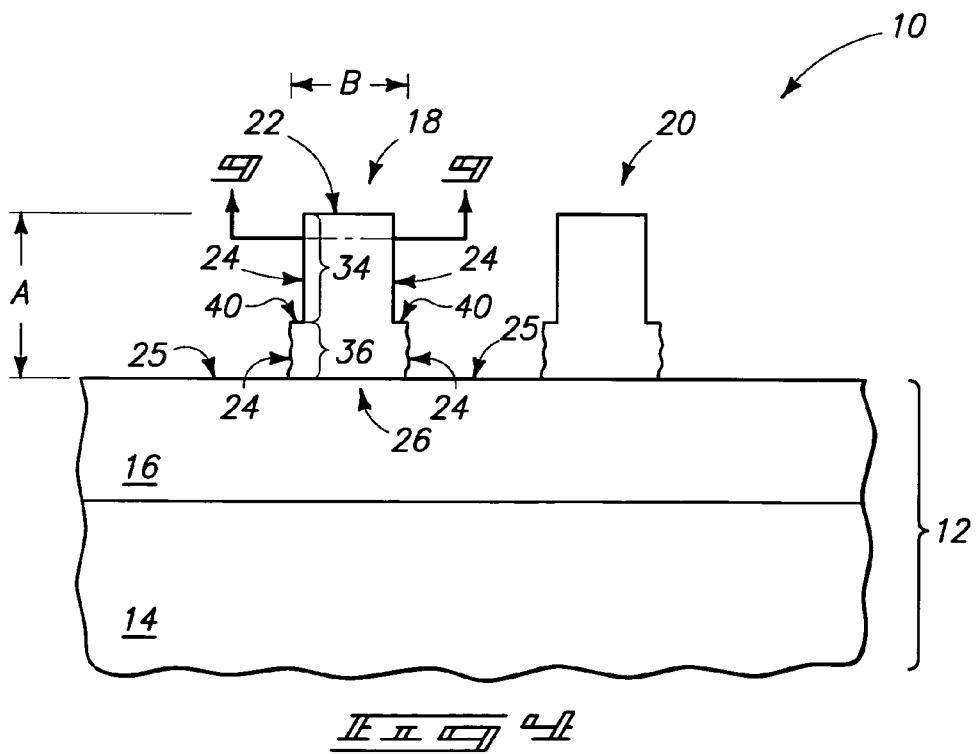
FIG. 4 is a view the FIG. 3 substrate fragment at a processing subsequent to that shown by FIG. 3.

Referring to FIG. 4, and in but one exemplary implementation, an aspect of the invention comprises removing all of $Si_xC_yF_z$—comprising layer 30 (not shown) from over substrate 12 at some point in the processing. For example, FIG. 4 depicts the FIG. 3 substrate having been etched in a manner to remove $Si_xC_yF_z$—comprising layer 30 substantially selectively from substrate fragment 10 relative to the material(s) of which feature 18 is made and relative to material 16. In the context of this document, a substantially selective etch requires a removal of the material being etched to the underlying material at a rate of at least 2:1. By way of example only, a preferred etching technique to produce the FIG. 4 construction from that of FIG. 3 includes $O_2$ plasma etching.

The just-described embodiment utilized at least two different chemistry etching steps to produce the exemplary FIG. 4 construction from that of FIG. 2. However, the invention also contemplates fabricating a structure like that of FIG. 4 from that of FIG. 2 using only a single, common chemistry, etching step. For example, the etching gas and conditions (perhaps including varying the conditions during the etch) can be selected and optimized by the artisan wherein a single chemistry can be utilized which proceeds directly from FIG. 2 to the exemplary FIG. 4 construction. Where two different chemistry etching steps are utilized, one preferred implementation conducts a later-in-time of at least two different chemistry etching steps to have greater selectivity in removing $Si_xC_yF_z$ relative to feature 18 than any degree of selectivity in removing $Si_xC_yF_z$ relative to feature 18 in an earlier-in-time of such at least two different chemistry etching steps.

FIGS. 5-9 depict an exemplary, not necessarily limiting, manner and/or theory by which preferred sidewall roughness can or might be reduced. However, aspects of the invention are not limited by such method or theory, nor is roughness reduction required in aspects of the invention unless literally claimed. Regardless, FIG. 5 in an enlarged manner depicts an exemplary feature 18 in cross-section prior to the deposition of $Si_xC_yF_z$-comprising layer 30 and having sidewall 24 roughness and variation depicted in one example. FIG. 6 depicts $Si_xC_yF_z$-comprising layer 30 deposition over opposing feature sidewalls 24. FIG. 7 depicts the etching of $Si_xC_yF_z$-comprising layer 30, preferably isotropically, and at an etching rate that is preferably at least slightly faster than that of the material(s) of which feature 18 is fabricated so that the maximum-protruding points/projections are exposed. These protrusions as well get etched subsequently as the etch continues, while lesser-protruding projections and valleys therebetween are likely protected to a degree during subsequent etching (FIG. 8). Once all or a desired amount of $Si_xC_yF_z$-comprising layer 30 has been etched away from sidewalls 24, continued etching using the same essential chemistry and/or conditions (or using a different chemistry and/or conditions) can be utilized to remove all remaining of $Si_xC_yF_z$-comprising layer 30 from the substrate (FIG. 9), if desired.

Referring to FIG. 10, substrate 12 has been etched using masking features 18 and 20 as a mask. Again, the material(s) of substrate 12 which is etched might be of the same or different composition from that/those of features 18 and 20 depending upon the materials utilized and the structures desired. FIG. 10 illustrates an exemplary etch whereby material 16 is etched at least substantially selectively relative to material(s) 14 and the material(s) of features 18 and 20.

Regardless and by way of example only, FIG. 10 also illustrates the etching of substrate 12 having occurred also using steps 40 of feature 18 as a mask. By way of example only, FIG. 11 illustrates an alternate embodiment substrate fragment 10a. Like numerals from the first-described embodiment have been utilized where appropriate, with differences being indicated with the suffix "a". FIG. 11 illustrates etching of the masking features as previously having steps 40 (not shown) effective to remove such steps and form masking features 18a and 20a to be void of any steps. Such etching can be conducted substantially selectively relative to substrate 12, or alternately not. An exemplary etching chemistry to produce the FIG. 11 construction where features 18a and 20a comprise carbon-containing photoresist includes (in a LAM TCP 9400 etcher) 20 mTorr, 600 W top power, 200 W bottom power, 75 sccm $CF_4$ and 75 sccm He.

Figure 12:
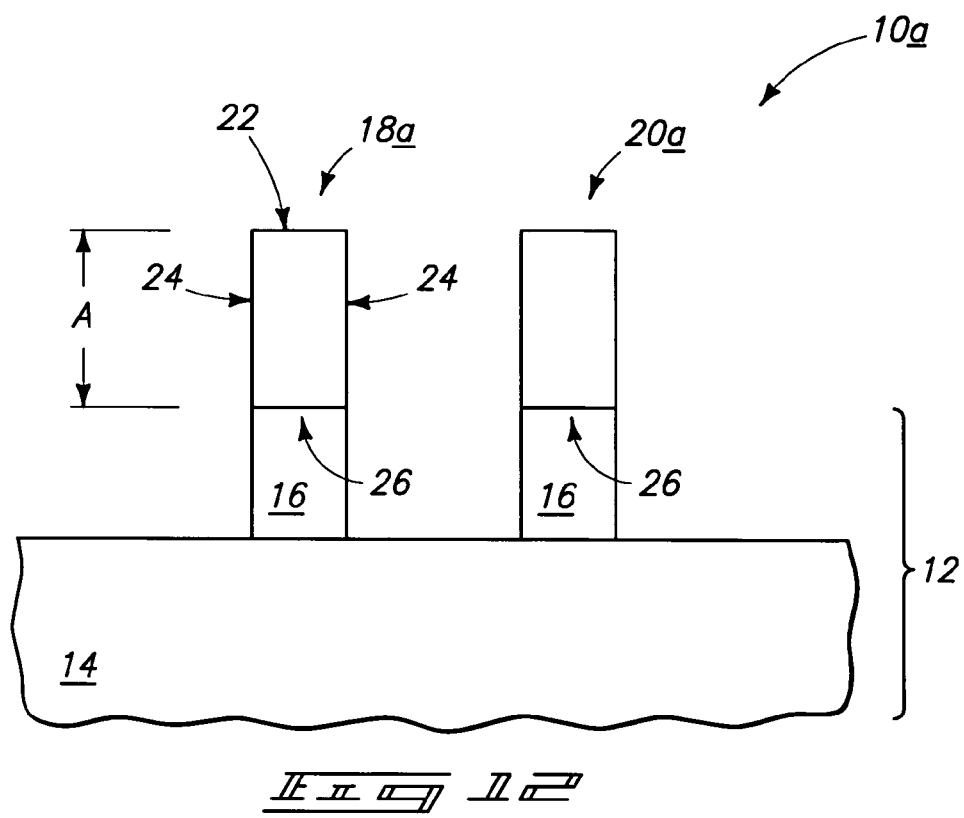
FIG. 12 is a view the FIG. 11 substrate fragment at a processing subsequent to that shown by FIG. 11.

FIG. 12 illustrates exemplary subsequent etching of substrate 12 (specifically layer 16 selectively relative to layer 14, by way of example only) using masking features 18a and 20a as a mask.

Figure 13:
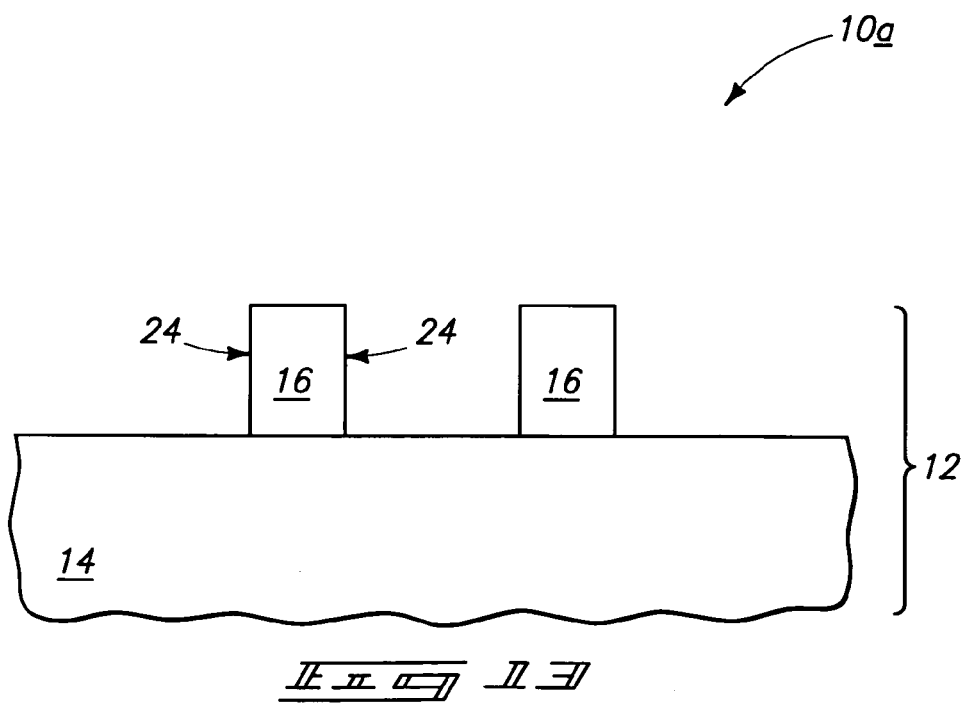
FIG. 13 is a view the FIG. 12 substrate fragment at a processing subsequent to that shown by FIG. 12.

Depending upon the materials and the desired construction, the masking features might be sacrificial or some or all remaining portions thereof might be left on the substrate. By way of example only, FIG. 13 depicts removing features 18a and 20a (not shown) from the substrate subsequent to the FIG. 12 processing. (Such could also, of course, occur subsequent to the FIG. 10 processing relative to substrate 10.) Regardless, a preferred technique for such removing is by an etching process, for example utilizing $O_2$ plasma for removing a carbon-containing photoresist selectively to most other underlying materials.

Aspects of the invention also encompass methods of forming a feature on a substrate independent of any subsequent act of etching, for example and by way of example only, the formation of feature 18 of FIG. 4 and feature 18a of FIG. 11. Further for example and by way of example only, a method of forming a feature on a substrate in accordance with one implementation of the invention comprises providing a construction projecting from a substrate, for example construction 18 of FIG. 1. Preferred attributes of construction 18 and a substrate 12 over which such is formed are otherwise as described above in connection with the first-described embodiment in connection with feature 18. A layer comprising $Si_xC_yF_z$ is deposited over the construction, where "x" is from zero to 0.2, "y" is from 0.3 to 0.9, and "z" is from 0.1 to 0.6. A preferred exemplary such layer is layer 30, as depicted in FIG. 2. Preferred attributes of such layer are otherwise as described above in connection with the first-described embodiment.

The $Si_xC_yF_z$-comprising layer is etched, and upper portions of the construction opposing sidewalls are etched, effective to laterally recess the upper portions of the construction opposing sidewalls proximate the construction top relative to lower portions of the construction opposing sidewalls proximate the construction base. The processing depicted and described above in the first-described embodiment, with respect to FIGS. 3-9, are exemplary such etching techniques including, by way of example only, all preferred aspects thereof. Accordingly, by way of example only, $Si_xC_yF_z$ material might remain over the substrate after the etching which, at least initially, forms the laterally recessed upper portions, or alternately might be entirely removed from the substrate by such etching action. Further if any $Si_xC_yF_z$ material remains after such etching, such might be subsequently removed or remain, and if removed, may utilize an etching chemistry which is different from that used to initially form the laterally recessed upper portions.

Exemplary layer 30 might be deposited/formed by any existing or yet-to-be developed manner(s), for example including any of physical vapor deposition, chemical vapor deposition, and/or atomic layer deposition and including subsequent acts of processing such layer after deposition. Regardless, plasma may or may not be utilized. In one exemplary preferred technique, the depositing of layer 30 occurs within a deposition chamber which includes at least some exposed silicon-comprising chamber component other than substrate 10 being deposited upon (even assuming such contains exposed silicon). A gas comprising carbon and fluorine is fed to feature 18 within the deposition chamber under conditions effective to deposit the $Si_xC_yF_z$-comprising layer 30 over feature 18, and where in this particular example "x" is some value greater than zero. Silicon in the deposited $Si_xC_yF_z$-comprising layer at least partially (and in one preferred embodiment entirely) comes from silicon which is removed from said silicon-comprising chamber component during the gas feeding. In exemplary preferred embodiments, the silicon-comprising component comprises one or a combination of an internal wall of the deposition chamber or a focus ring within the deposition chamber.

Figure 14:
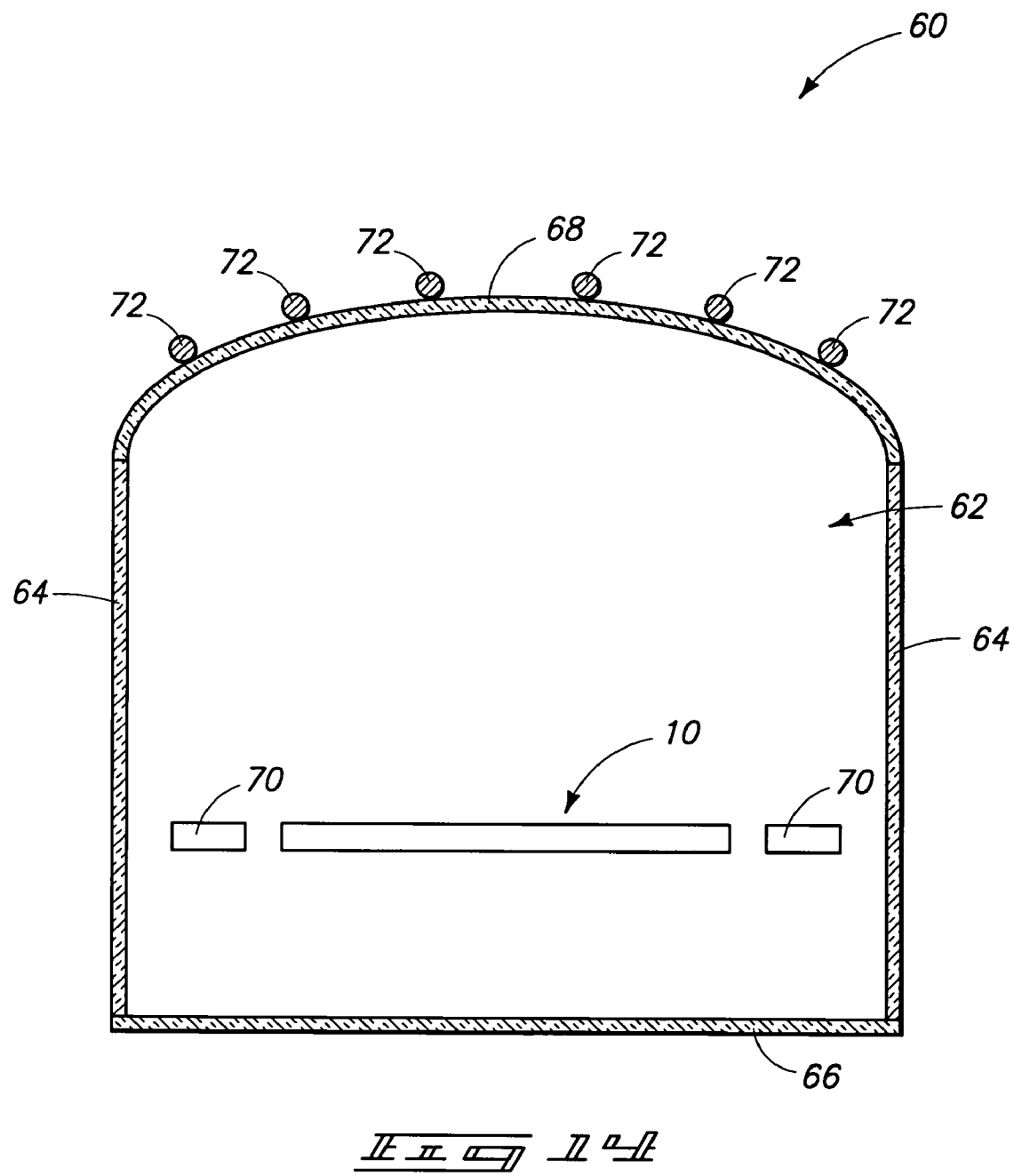
FIG. 14 is a diagrammatic view of a deposition chamber useable in accordance with an aspect of the invention.

The invention was reduced-to-practice in an inductively coupled plasma reactor wherein the deposition conditions comprised plasma generation of the gas within the chamber, wherein the internal wall comprised a top wall which consisted essentially of silicon, and included a focus ring consisting essentially of silicon surrounded the substrate being deposited upon. FIG. 14 diagrammatically depicts an exemplary such inductively coupled plasma reactor 60. Such comprises a deposition chamber 62 having sidewalls 64, a base 66 and an exemplary top wall dome 68. Substrate 10 is received therein for deposition processing, and a focus ring 70, as a component of the reactor, encircles substrate 10. Inductive power coils 72 are received outwardly of chamber 62 proximate top wall/dome 68, and substrate 10 would typically be powered/biased by a power source (not shown) for producing suitable power for plasma enhanced deposition processing in accordance with but one preferred embodiment.

The invention was reduced-to-practice in an Applied Material AME482 processing tool. Pressure during deposition was 8 mtorr, substrate bias at 50 Watts, upper power at 1,500 Watts, wafer temperature at −10° C., and a deposition time of 20 seconds. Gas flow to the chamber was $CF_4$ and Ar at respective flow rates of 50 sccm and 100 sccm. Accordingly in this example, the gas comprising carbon and fluorine fed to the chamber en route to feeding to the feature and substrate constituted an exemplary fluorocarbon. However, aspects of the invention also contemplate no fluorocarbon gases being fed to the substrate whereby, for example, carbon and fluorine are provided from different compounds not containing both carbon and fluorine individually but collectively containing carbon and fluorine. Regardless, in the above example, an exemplary preferred flow rate range for the $CF_4$ is from 10 sccm to 150 sccm. A preferred argon flow rate, in such example, is from 0 to 500 sccm. During such deposition, no silicon-containing gas was flowed to the chamber and silicon was present in the $Si_xC_yF_z$-comprising layer, although it was not determined whether such silicon derived or came from only one or both of the silicon focus ring or the silicon top wall. Regardless, a portion of at least one of such silicon-containing components was removed during the gas feeding under the deposition conditions, with such removed portion thereby consisting essentially of silicon and at least some of which ended up in the deposited layer. Such provides but only one exemplary preferred embodiment for forming a $Si_xC_yF_z$-comprising layer over a feature, for example as shown and described above in connection with FIG. 2.

However, the invention also contemplates a method of depositing any layer comprising silicon, carbon and fluorine onto a semiconductor substrate which includes positioning a semiconductor substrate within a deposition chamber, where the deposition chamber includes at least some exposed silicon-comprising component other than the semiconductor substrate being deposited upon (assuming such even contains silicon). Gas comprising carbon and fluorine is fed to the semiconductor substrate within the deposition chamber under conditions effective to deposit a layer comprising silicon, carbon and fluorine onto the semiconductor substrate. The silicon in such layer at least partially (and in one preferred embodiment entirely) comes from silicon which is removed from the silicon-comprising component during such gas feeding. Preferred processing is otherwise as described above, and which may or may not produce the constructions and compositions as described above, and wherein the semiconductor substrate may or may not comprise a projecting feature as described above.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of depositing a layer comprising silicon, carbon and fluorine onto a semiconductor substrate, comprising:
   positioning a semiconductor substrate within a deposition chamber, the deposition chamber including an exposed silicon-comprising component, said chamber component being something other than the semiconductor substrate; and
   feeding gas comprising carbon and fluorine to the semiconductor substrate within the deposition chamber under conditions effective to deposit a layer comprising silicon, carbon, and fluorine onto the semiconductor substrate; said silicon in such layer at least partially coming from silicon which is removed from said silicon-comprising component during said feeding.

2. The method of claim 1 wherein said silicon in the layer comprising silicon, carbon, and fluorine entirely comes from silicon which is removed from said silicon-comprising chamber component during said feeding.

3. The method of claim 1 wherein the silicon-comprising component comprises an internal wall of the deposition chamber.

4. The method of claim 2 wherein the deposition chamber comprises an inductively coupled plasma reactor and the conditions comprise plasma generation of said gas, the internal wall comprising a top wall.

5. The method of claim 1 wherein the silicon-comprising component comprises a focus ring.

6. The method of claim 1 wherein said silicon-comprising component comprises a portion thereof which is removed during said feeding under said conditions, said portion consisting essentially of silicon.

7. The method of claim 1 wherein the gas is fed to the chamber en route to feeding to the semiconductor substrate, said gas fed to the chamber being void of silicon.

8. The method of claim 1 wherein the gas is fed to the chamber en route to feeding to the semiconductor substrate, said gas fed to the chamber comprising a fluorocarbon compound.

9. The method of claim 1 wherein the gas is fed to the chamber en route to feeding to the semiconductor substrate, said gas fed to the chamber being void of any fluorocarbon compound.

10. The method of claim 1 wherein the layer comprises $Si_xC_yF_z$ where "x" is from 0 to 0.2, "y" is from 0.3 to 0.9, and "z" is from 0.1 to 0.6.

11. The method of claim 10 wherein "x" is greater than zero.

12. The method of claim 11 wherein "y" is from 0.6 to 0.9 and "z" is from 0.1 to 0.4.

13. The method of claim 10 wherein "x" is from 0 to 0.0015, "y" is from 0.5 to 0.7, and "z" is from 0.3 to 0.4.

14. A method of depositing a layer comprising silicon, carbon and fluorine onto a semiconductor substrate, comprising:
   positioning a semiconductor substrate within a deposition chamber, the semiconductor substrate comprising a projecting feature, the semiconductor substrate having an upper surface proximate the feature, the feature having a top, opposing sidewalls, and a base; the layer being deposited over the feature and said substrate upper surface, the layer having a minimum elevational thickness over said substrate upper surface and a minimum elevational thickness over the feature top which are each greater than a minimum lateral thickness over each of the feature opposing sidewalls, the deposition chamber including an exposed silicon-comprising component, said chamber component being something other than the semiconductor substrate; and
   feeding gas comprising carbon and fluorine to the semiconductor substrate within the deposition chamber under conditions effective to deposit a layer comprising silicon, carbon, and fluorine onto the semiconductor substrate over the feature; said silicon in such layer at least partially coming from silicon which is removed from said silicon-comprising component during said feeding.

15. The method of claim 14 wherein the layer minimum elevational thickness over said substrate upper surface and the layer minimum elevational thickness over the feature top are the same.

16. The method of claim 14 wherein the layer minimum elevational thickness over said substrate upper surface and the layer minimum elevational thickness over the feature top are different.

17. The method of claim 14 wherein the feature projects relative to said substrate upper surface a distance "A", the layer minimum elevational thickness over said substrate upper surface being from 5% to 70% of "A".

18. The method of claim 17 wherein the layer minimum elevational thickness over said substrate upper surface is from 10% to 30% of "A".

19. The method of claim 14 wherein the feature has a widest lateral width "B" proximate said substrate upper surface, the layer minimum lateral thickness being from 1% to 30% of "B".

20. The method of claim 19 wherein the layer minimum lateral thickness is from 5% to 15% of "B".

21. The method of claim 14 wherein the layer comprises $Si_xC_yF_z$ where "x" is from 0 to 0.2, "y" is from 0.3 to 0.9, and "z" is from 0.1 to 0.6.

22. The method of claim 21 wherein "x" is greater than zero.

23. A method of etching a substrate, comprising:
   forming a masking feature projecting from a substrate; the feature having a top, opposing sidewalls, and a base; the feature comprising a combination of at least two of conductive material, insulative material, and semiconductive material above said base;
   depositing a layer comprising $Si_xC_yF_z$ over the feature where "x" is from 0 to 0.2, "y" is from 0.3 to 0.9, and "z" is from 0.1 to 0.6;
   etching the $Si_xC_yF_z$—comprising layer and etching upper portions of the feature opposing sidewalls effective to laterally recess the upper portions of the feature opposing sidewalls proximate the feature top relative to lower portions of the feature opposing sidewalls proximate the feature base; and after said etching of the $Si_xC_yF_z$—comprising layer and said etching of upper portions of the feature sidewalls, etching the substrate using the masking feature as a mask.

24. A method of etching a substrate, comprising:

forming a masking feature projecting from a substrate; the feature having a top, opposing sidewalls, and a base; the feature comprising a combination of at least two different composition materials above said base;

depositing a layer comprising $Si_xC_yF_z$ over the feature where "x" is from 0 to 0.2, "y" is from 0.3 to 0.9, and "z" is from 0.1 to 0.6;

etching the $Si_xC_yF_z$—comprising layer and etching upper portions of the feature opposing sidewalls effective to laterally recess the upper portions of the feature opposing sidewalls proximate the feature top relative to lower portions of the feature opposing sidewalls proximate the feature base; and after said etching of the $Si_xC_yF_z$—comprising layer and said etching of upper portions of the feature sidewalls, etching the substrate using the masking feature as a mask.

25. The method of claim 24 wherein at least one of the materials comprises a hard masking layer.

26. The method of claim 24 wherein at least one of the materials comprises silicon dioxide.

27. The method of claim 24 wherein at least one of the materials comprises silicon nitride.

28. A method of etching a substrate, comprising:

forming a masking feature projecting from a substrate, the substrate having an upper surface proximate the feature; the feature having a top, opposing sidewalls, and a base;

depositing a layer comprising $Si_xC_yF_z$ over the feature where "x" is from 0 to 0.2, "y" is from 0.3 to 0.9, and "z" is from 0.1 to 0.6; the $Si_xC_yF_z$—comprising layer having a minimum elevational thickness over said substrate upper surface and a minimum elevational thickness over the feature top which are each greater than a minimum lateral thickness over each of the feature opposing sidewalls;

etching the $Si_xC_yF_z$—comprising layer and etching upper portions of the feature opposing sidewalls effective to laterally recess the upper portions of the feature opposing sidewalls proximate the feature top relative to lower portions of the feature opposing sidewalls proximate the feature base, said etching of the $Si_xC_yF_z$—comprising layer and said etching of upper portions of the feature sidewalls comprising etching both the $Si_xC_yF_z$—comprising layer and the upper portions of the feature sidewalls in a single, common chemistry, etching step in which conditions are varied during said etching; and after said etching of the $Si_xC_yF_z$—comprising layer and said etching of upper portions of the feature sidewalls, etching the substrate using the masking feature as a mask.

* * * * *

UNITED STATES PATENT AND TRADEMARK OFFICE
CERTIFICATE OF CORRECTION

| | | |
|---|---|---|
| PATENT NO. | : 7,473,645 B2 | Page 1 of 1 |
| APPLICATION NO. | : 11/601362 | |
| DATED | : January 6, 2009 | |
| INVENTOR(S) | : Abatchev et al. | |

It is certified that error appears in the above-identified patent and that said Letters Patent is hereby corrected as shown below:

In column 9, line 37, in Claim 4, delete "claim 2" and insert -- claim 3 --, therefor.

Signed and Sealed this

Fifth Day of May, 2009

JOHN DOLL
*Acting Director of the United States Patent and Trademark Office*